United States Patent [19]

Koibuchi et al.

[11] Patent Number: 5,215,858

[45] Date of Patent: Jun. 1, 1993

[54] PHOTOSENSITIVE RESIN COMPOSITION AND PATTERN FORMATION USING THE SAME

[75] Inventors: Shigeru Koibuchi; Asao Isobe, both of Hitachi; Michiaki Hashimoto, Sayama, all of Japan

[73] Assignees: Hitachi Chemical Company, Ltd.; Hitachi, Ltd., both of Tokyo, Japan

[21] Appl. No.: 326,740

[22] Filed: Mar. 21, 1989

[30] Foreign Application Priority Data

Mar. 23, 1988 [JP] Japan ................... 63-68465

[51] Int. Cl.⁵ .................... G03F 7/023; G03C 1/61
[52] U.S. Cl. .................... 430/191; 430/192; 430/512
[58] Field of Search ............... 430/191, 192, 512, 179

[56] References Cited

U.S. PATENT DOCUMENTS

| | | | |
|---|---|---|---|
| 4,174,222 | 11/1979 | Komine et al. | 430/190 |
| 4,297,428 | 10/1981 | Yamamoto | 430/512 |
| 4,330,608 | 5/1982 | Limburg et al. | 430/512 |
| 4,486,518 | 12/1984 | Kesselman et al. | 430/512 |
| 4,847,178 | 7/1989 | Komano | 430/192 |
| 4,871,644 | 10/1989 | Bauer | 430/192 |

OTHER PUBLICATIONS

Patent Abstracts of Japan, vol. 7, No. 270, Dec. 1983.

*Primary Examiner*—Charles L. Bowers, Jr.
*Assistant Examiner*—Christopher G. Young
*Attorney, Agent, or Firm*—Antonelli, Terry, Stout & Kraus

[57] ABSTRACT

A photosensitive resin composition comprising (A) an alkaline aqueous solution-soluble novolak resin, (B) a photosensitizer obtained by reacting a polyhydroxy compound with 1,2-naphthoquinone-(2)-diazido-5(or 4)-sulfonyl chloride, and (C) an ultraviolet absorber such as 2-(2'-hydroxy-5'-methylphenyl)-benzotriazole, has a strong absorption against a light of a wavelength of 365 nm and is suitable for producing semiconductor elements, etc.

2 Claims, No Drawings

PHOTOSENSITIVE RESIN COMPOSITION AND PATTERN FORMATION USING THE SAME

BACKGROUND OF THE INVENTION

This invention relates to a positive-type photosensitive resin composition having strong UV light absorption and a process for forming a pattern using the same.

As fine processing technique for semiconductor elements, there is widely employed pattern formation using a positive-type photosensitive resin composition and a g-line (light of 436 nm) projection aligner. In order to improve the resolving power of a photosensitive resin, there are employed an improvement of the photosensitive resin and an improvement of a light exposing device. The light exposing device can be improved by increasing the numerical aperture of lens or making the exposing wavelength shorter. The resolving power is proportional to the exposing wavelength and can be improved by about 16% by changing the g-line to i-line (light of 365 nm). A light exposing device using a shorter wavelength of near 250 nm is now under development, but it requires a much more time to accomplish such a device.

Thus, a light exposing device using i-line is noticed. As a photosensitive resin used in such a device, there is used a composition comprising a novolak resin and 1,2-naphthoquinone-(2)-diazido-sulfonic acid ester as a photosensitizer (e.g. Japanese Patent Examined Publication Nos. 37-18015 and 54-20330, and Japanese Patent Unexamined Publication Nos. 62-28457 and 62-89040). Such a photosensitive resin composition can be used on a silicon oxide film and silicon nitride film, it but causes a problem of narrowing of patterns due to reflected light when used on a substrate having a high light reflectance such as an aluminum film.

SUMMARY OF THE INVENTION

It is an object of the present invention to provide a photosensitive resin composition of positive type having a small light reflectance from a substrate when the i-line is used, and strong light absorption.

The present invention provides a photosensitive resin composition comprising (A) an alkaline aqueous solution-soluble novalak resin, (B) a photosensitizer obtained by reacting at least one polyhydroxy compound selected from the group consisting of gallic acid esters, trihydroxybenzophenone and tetrahydroxybenzophenone, with 1,2-naphthoquinone-(2)-diazido-5-sulfonyl chloride or 1,2-naphthoquinone-(2)-diazido-4-sulfonyl chloride, and (C) an ultraviolet absorber represented by the formula:

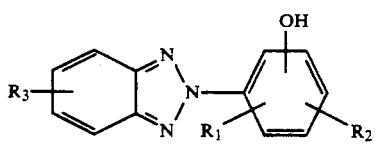

(I)

wherein $R_1$ and $R_2$ are independently a hydrogen atom or an alkyl group having 1 to 10 carbon atoms; and $R_3$ is a hydrogen atom or a halogen atom, the amount of (A) being 90 to 71 parts by weight and the amount of (B) being 10 to 29 parts by weight, a total of (A) and (B) being 100 parts by weight, and the amount of (C) being 0.1 to 10 parts by weight based on 100 parts by weight of the total of (A) and (B).

This invention also provides a process for forming a pattern, which comprises coating the above-mentioned photosensitive resin composition on a substrate, drying the composition to form a photosensitive film, and subjecting the photosensitive film to exposure to light and development.

DESCRIPTION OF THE PREFERRED EMBODIMENTS

The component (A) is an alkaline aqueous solution-soluble novolak resin. The words "alkaline aqueous solution-soluble" mean a resin soluble in an alkaline aqueous solution such as an aqueous solution of 5% by weight or less of sodium hydroxide, potassium hydroxide, tetramethyl ammonium hydroxide, chloline, or the like.

As the novolak resin, there can be used condensation resins of a phenol such as phenol, cresol, xylenol, or the like with formaldehyde, having a softening point of preferably 135° to 165° C. from the viewpoint of heat resistance and synthesis. The softening point of novolak resin can be adjusted by a conventional method. The softening point can be obtained according to JIS K 2207.

Such a novolak resin can be synthesized, for example, by reacting a phenol with formaldehyde in the presence of a catalyst such as hydrochloric acid, oxalic acid, or the like at 60° to 120° C. for several hours, and removing water and the unreacted phenol with heating under reduced pressure.

The photosensitizer (B) can be obtained by dissolving at least one polyhydroxy compound selected from the group consisting of gallic acid esters such as methyl gallate, ethyl gallate, propyl gallate, etc., trihydroxybenzophenone and tetrahydroxybenzophenone, and 1,2-naphthoquinone-(2)-diazido-5-sulfonyl chloride or 1,2-naphthoquinone-(2)-diazido-4-sulfonyl chloride in a solvent such as dioxane, tetrahydrofuran, acetone, methyl ethyl ketone, water, Cellosolve, etc. and reacting using a basic catalyst for accelerating the reaction.

As the basic catalyst, there can be used inorganic bases such as sodium carbonate, potassium carbonate, sodium hydroxide, potassium hydroxide, etc., and organic bases such as triethylamine, triethanolamine, diethylamine, etc.

The reaction temperature is not particularly limited, but is preferably in the range of 0° to 40° C. from the viewpoint of the stability of the main product and reaction rate. Further, the reaction can preferably be carried out under a yellow light or a red light.

1,2-Naphthoquinone-(2)-diazido-5-sulfonyl chloride or 1,2-naphthoquinone-(2)-diazido-4-sulfonyl chloride can be used in an amount of preferably 1.5 to 4 moles per mole of the polyhydroxy compound.

As the ultraviolet (UV) absorber (C), there is used a compound of the formula:

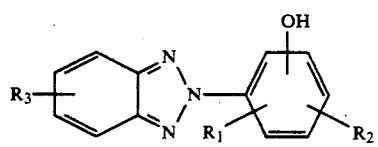

(I)

wherein $R_1$ and $R_2$ are independently a hydrogen atom or an alkyl group having 1 to 10 carbon atoms; and $R_3$ is a hydrogen atom or a halogen atom.

Examples of the compound of the formula (I) are 2-(2'-hydroxy-5'-methylphenyl)-benzotriazole, 2-(2'-hydroxy-3',5'-di-t-butylphenyl)-5-chlorobenzotriazole, 2-(2'-hydroxy-3'-t-butyl-5'-methylphenyl)-5-chlorobenzotriazole, 2-(2'-hydroxy-3',5'-di-t-amylphenyl)-benzotriazole, 2-(2'-hydroxy-3',5'-di-t-butylphenyl)-benzotriazole, 2-(2'-hydroxy-5'-t-butylphenyl)-benzotriazole, 2-(2'-hydroxy-5'-t-octylphenyl)-benzotriazole, etc. These compounds can be commercially available from Ciba-Geigy AG or Shipuro Kasei K.K., etc.

The alkaline aqueous solution-soluble novolak resin (A), the photosensitizer (B) and the UV absorber (C) can be used in amounts of (A)/(B)=90 to 71/10 to 29 (weight ratio), a total of (A) and (B) being 100 parts by weight, and 0.1 to 10 parts by weight of (C) per 100 parts by weight of the total of (A) and (B). When the amount of the alkaline aqueous solution-soluble novolak resin is more than 90 parts by weight and the photosensitizer (B) is less than 10 parts by weight, the total of (A) and (B) being 100 parts by weight, a film loss at the time of development increases. On the other hand, when (A) is less than 71 parts by weight and (B) is more than 29 parts by weight, the total of (A) and (B) being 100 parts by weight, sensitivity is lowered. When the amount of (C) is less than 0.1 part, the effect of absorbing UV rays is small, while when the amount of (C) is more than 10 parts by weight, the solubility in a solvent becomes insufficient.

The photosensitive resin composition of the present invention may further contain a solvent.

The positive-type photosensitive resin composition is dissolved in a solvent and coated on a surface of substrate made of, for example, silicon, aluminum, quartz, glass, etc.

As the solvent, there can be used ketones such as methyl ethyl ketone, methyl isobutyl ketone, cyclohexanone, etc.; aromatic solvents such as toluene, xylene, etc.; ethylene glycol monoalkyl ethers and alkoxy ethyl acetates such as ethylene glycol monomethyl ether, mothoxyethyl acetate, ethoxyethyl acetate, etc.; esters such as ethyl acetate, butyl acetate, isoamyl acetate, etc.; alcohols such as methanol, ethanol, propanol, etc. These solvents can be used alone or as a mixture thereof.

In the photosensitive resin composition of the present invention, the photosensitizer (B) is decomposed photochemically and becomes alkaline aqueous solution-soluble after the decomposition. The photochemical decomposition can be carried out by a conventional means such as irradiation with a mercury lamp, etc. As the alkaline aqueous solution, there can be used aqueous solutions of 5% by weight or less of sodium hydroxide, potassium hydroxide, tetramethyl ammonium hydroxide, choline, and the like.

The photosensitive resin composition of the present invention may further contain one or more conventionally used additives such as thermal polymerization inhibitors for improving storage stability, adhesiveness improving agents for improving adhesiveness to the substrate, etc., depending on purposes.

According to the present invention, a pattern can be formed on a substrate made of, for example, silicon, aluminum, quartz, glass, etc., by a conventional process, e.g. by coating the above-mentioned photosensitive resin composition on the substrate, drying the composition to form a photosensitive film, and subjecting the photosensitive film to exposure to light and development.

The present invention is illustrated by way of Examples, in which all parts and percents are by weight, unless otherwise specified.

EXAMPLE 1

A photosensitive resin composition was prepared by dissolving 20 parts of cresol novolak resin containing m-cresol/p-cresol in a weight ratio of 55/45 and having a softening point of 150° C. (hereinafter referred to as "(A-1)"), 6 parts of a photosensitizer obtained by reacting 1 mole of methyl gallate with 2.5 moles of 1,2-naphthoquinone-(2)-diazido-5-sulfonyl chloride (hereinafter referred to as "(B-1)") and 0.52 part of 2-(2'-hydroxy-5'-methylphenyl)-benzotriazole (mfd. by Shipuro Kasei K.K.) in 74 parts of ethoxyethyl acetate.

The resulting composition was spin coated on a silica substrate at 3000 rpm for 30 seconds, and dried at 90° C. for 20 minutes to give a light-sensitive film of 1 μm thick.

The resulting substrate was subjected to measurement of transmittance using a spectrophotometer (mfd. by Hitachi, Ltd.) at a wavelength of 365 nm with a result of as low as 18%. Thus, a strong absorption was obtained.

The above-mention composition was coated on a silicon wafer having an aluminum film thereon under the same conditions as mentioned above, and exposed to a light of 365 nm using a light exposing device LD-5010 i (a trade name, mfd. by Hitachi, Ltd.) via a photo-mask for 700 msec., developed by using an aqueous solution 2.38% of tetramethyl ammonium (hereinafter referred to as "Developing solution (1)") at 23° C. for 60 seconds, and rinsed with deionized water for 60 seconds to give a pattern having a line width of 0.7 μm.

EXAMPLE 2

A photosensitive resin composition was prepared by dissolving 20 parts of cresol novolak resin containing m-cresol/p-cresol in a weight ratio of 60/40 and having a softening point of 155° C. (hereinafter referred to as "(A-2)"), 5.5 parts of a photosensitizer obtained by reacting 1 mole of 2,3,4-trihydroxybenzophenone with 3 moles of 1,2-naphthoquinone-(2)-diazido-5-sulfonyl chloride (hereinafter referred to as "(B-2)") and 0.77 part of 2-(2'-hydroxy-5'-t-butylphenyl)-benzotriazole in 74 parts of ethoxyethyl acetate.

A light-sensitive film of 1 μm thick was obtained in the same manner as described in Example 1 using the above-mentioned composition.

The resulting substrated was subjected to the measurement of transmittance at a wavelength of 365 nm in the same manner as described in Example 1. The obtained value was as low as 17%. Thus, a strong absorption was obtained.

EXAMPLE 3

A photosensitive resin composition was prepared by dissolving 20 parts of (A-1) as a cresol novolak resin obtained in Example 1, 5.5 parts of a photosensitizer obtained by reacting 1 mole of 2,3,4,4'-tetrahydroxybenzophenone with 3.3 moles of 1,2-naphthoquinone-(2)-diazido-5-sulfonyl chloride (hereinafter referred to as "(B-3)") and 1.0 part of 2-(2'-hydroxy-5'-t-octylphenyl)-benzotriazole in 75 parts of ethoxyethyl acetate.

Using said composition, a light-sensitive film of 1 μm thick was obtained in the same manner as described in Example 1.

The resulting substrate was subjected to the measurement of transmittance at a wavelength of 365 nm in the same manner as described in Example 1. The obtained value was as low as 12%. Thus, a strong absorption was obtained.

COMPARATIVE EXAMPLE 1

A photosensitive resin composition was prepared in the same manner as described in Example 1 except for not using 2-(2'-hydroxy-5'-methylphenyl)-benzotriazole. The photosensitive resin composition was coated on a silica substrate to give a light-sensitive film of 1 μm thick. The transmittance at a wavelength of 365 nm measured in the same manner as described in Example 1 was 25%.

COMPARATIVE EXAMPLE 2

A photosensitive resin composition was prepared in the same manner as described in Example 2 except for not using 2-(2'-hydroxy-5'-t-butylphenyl)-benzotriazole. A light-sensitive film was prepared in the same manner as described in Example 1 using the above-mentioned composition. The transmittance of a wavelength of 365 nm measured in the same manner as described in Example 1 was 25%.

COMPARATIVE EXAMPLE 3

A photosensitive resin composition was prepared in the same manner as described in Example 3 except for not using 2-(2'-hydroxy-5'-t-octylphenyl)-benzotriazole. A light-sensitive film was prepared in the same manner as described in Example 1 using the above-mentioned composition. The transmittance at a wavelength of 365 nm measured in the same manner as described in Example 1 was 24%.

As mentioned above, the photosensitive resin composition of the present invention has a strong absorption against the i-line light (wavelength 365 nm), and an effect of lessening light reflection from a substrate. Thus, the photosensitive composition of the present invention can be applied to various industrial fields such as photographic industry, printing industry, electronic industry, and the like.

What is claimed is:

1. A photosensitive resin composition providing a film having a high absorbency for a wavelength of 365 nm comprising an admixture of
   (A) an alkaline aqueous solution-soluble novolak resin,
   (B) a photosensitizer that is a reaction product of methyl gallate and 1,2-naphthoquinone-(2)-diazido-5-sulfonyl chloride, and
   (C) an ultraviolet absorber represented by the formula:

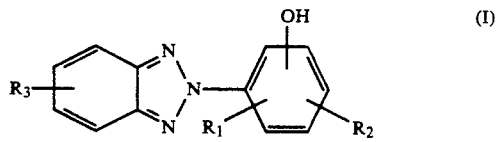

wherein $R_1$ and $R_2$ are independently a hydrogen atom or an alkyl group having 1 to 10 carbon atoms; and $R_3$ is a hydrogen atom or a halogen atom,
   the amount of (A) being 90 to 71 parts by weight and the amount of (B) being 10 to 29 parts by weight, a total of (A) and (B) being 100 parts by weight, and the amount of (C) being 0.1 to 10 parts by weight based on 100 parts by weight of the total of (A) and (B).

2. A photosensitive resin composition providing a film having a high absorbency for a wavelength of 365 nm comprising an admixture of
   (A) an alkaline aqueous solution-soluble novolak resin,
   (B) a photosensitizer that is a reaction product of methyl gallate and 1,2-napthoquinone-(2)-diazido-5-sulfonyl chloride, and
   (C) an ultraviolet absorber that is 2-(2'-hydroxy-5'-methylphenyl)-benzotriazole, 2-(2'-hydroxy-5'-tert-butylphenyl)-benzotriazole, or 2-(2'-hydroxy-5'-tert-octylphenyl)-benzotriazole,
   the amount of (A) being 90 to 71 parts by weight and the amount of (B) being 10 to 29 parts by weight, a total of (A) and (B) being 100 parts by weight, and the amount of (C) being 0.1 to 10 parts by weight based on 100 parts by weight of the total of (A) and (B).

* * * * *